(12) United States Patent
Iguchi et al.

(10) Patent No.: US 7,205,239 B2
(45) Date of Patent: Apr. 17, 2007

(54) METHOD OF MANUFACTURING SEMICONDUCTOR WAFER AND METHOD OF MANUFACTURING SEMICONDUCTOR DEVICE

(75) Inventors: Tomohiro Iguchi, Kawasaki (JP); Kentaro Suga, Kawasaki (JP); Taizo Tomioka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/203,097

(22) Filed: Aug. 15, 2005

(65) Prior Publication Data
US 2006/0032834 A1  Feb. 16, 2006

(30) Foreign Application Priority Data
Aug. 16, 2004  (JP) ............... 2004-236548

(51) Int. Cl.
H01L 21/302 (2006.01)
(52) U.S. Cl. ............ 438/692; 438/106; 438/691; 438/725; 438/745
(58) Field of Classification Search ........... 438/106, 438/113, 691, 692, 719, 725, 745, 753; 216/88, 216/91, 99
See application file for complete search history.

(56) References Cited

U.S. PATENT DOCUMENTS 5,851,845 A * 12/1998 Wood et al. ............... 438/15

6,506,681 B2 * 1/2003 Grigg et al. ............... 438/692

FOREIGN PATENT DOCUMENTS

JP  8-330880  12/1996

OTHER PUBLICATIONS

Streetman, Solid State Electronic Devices, 1990, Prentice Hall, 3rd ed., p. 371.*
Wolf, Silicon Processing for the VLSI Era, 1990, Lattice Press, vol. 2, pp. 222-223.*
H. Yatsuda, et al., "Flip-Chip Assembly Technique for SAW Devices", ISHM '95 Proceedings, pp. 365-370.

* cited by examiner

Primary Examiner—Lan Vinh
(74) Attorney, Agent, or Firm—Oblon, Spivak, McClelland, Maier & Neustadt, P.C.

(57) ABSTRACT

According to a method of manufacturing a semiconductor wafer and a semiconductor device, a rear surface of the semiconductor wafer is ground, and is dry- or wet-etched so that rear surfaces of semiconductor chips on the segmented semiconductor wafer have substantially equal surface roughness. The semiconductor chips are bonded onto a lead frame via bumps using thermo-compression and ultrasonic vibrations.

9 Claims, 13 Drawing Sheets

METHOD OF MANUFACTURING SEMICONDUCTOR WAFER AND METHOD OF MANUFACTURING SEMICONDUCTOR DEVICE

CROSS REFERENCE TO RELATED APPLICATION

This application is based upon and claims the benefit of priority from the prior Japanese Patent Application No. 2004-236,548 filed on Aug. 16, 2004, the entire contents of which are incorporated herein by reference.

BACKGROUND OF THE INVENTION

1. Field of the Invention

The present invention relates to a method of manufacturing a semiconductor wafer and a semiconductor device, and more particularly relates to a method of manufacturing a semiconductor wafer which is used to produce semiconductor chips to be mounted by thermo compression and ultrasonic vibrations, and a method of manufacturing a semiconductor device using such semiconductor chips.

2. Description of the Related Art

When electrodes of electronic components and electrodes of a wiring substrate are bonded by a flip chip bonding method, it is possible to reduce a 20 mounting area of such electrodes and to shorten circuit wirings. Therefore, the flip chip bonding method is preferable to pack elements and to mount high frequency devices. Japanese Patent Laid-Open Publication No. Hei 8-330,880 (page 1 and FIG. 1) and "Flip-Chip Assembly Technique for SAW Device (Pros. ISHM'95)" describe such a flip chip bonding method, in which no intermediate material is required and elements can be bonded with a reduced number of steps and in a short time period, thereby reducing a manufacturing cost.

Generally, semiconductor chips (including bare chips, chip scale packages and so on) as electronic components are manufactured as described hereinafter. First of all, an integrated circuit is made on a main surface of a semiconductor wafer 100. Then, the semiconductor wafer 100 is thinned down to approximately 250 μm thick, for example. Specifically, the rear surface of the semiconductor wafer 100 is ground by a grinding machine which is rotated via a spindle. Thereafter, the semiconductor wafer 100 is diced, thereby producing semiconductor chips 104.

Figure 15:
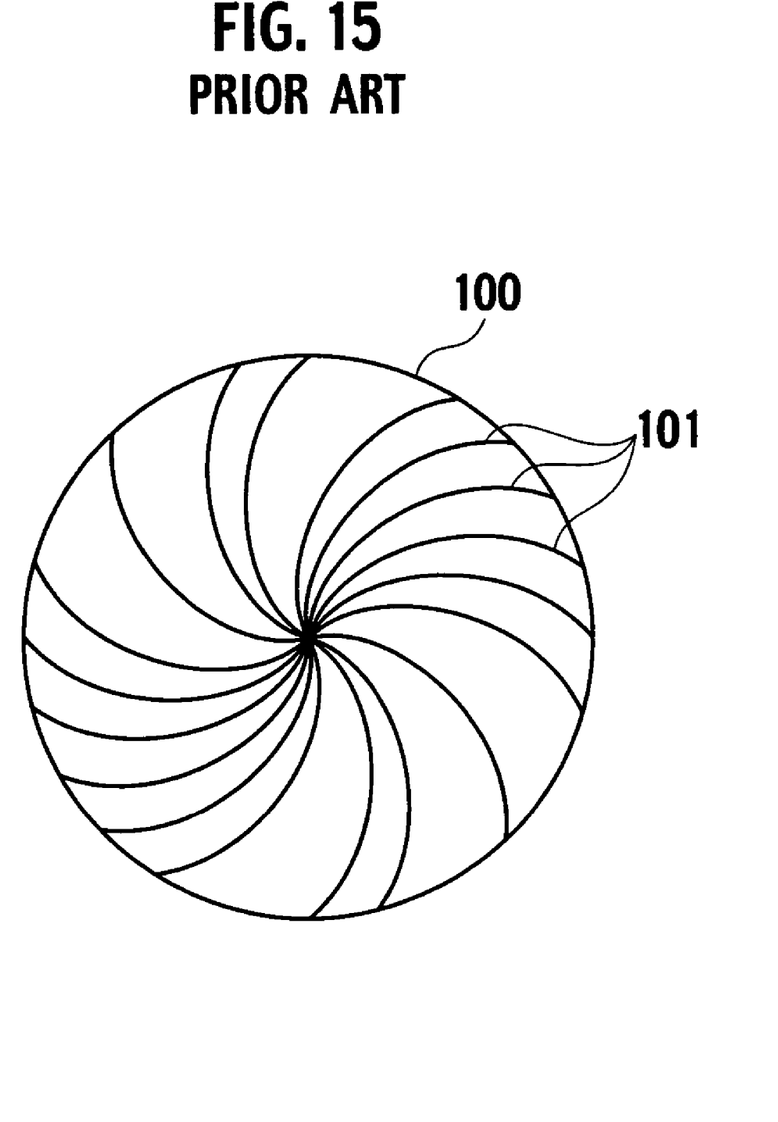
FIG. 15 is a plan view of a scratched rear surface of a semiconductor wafer in the related art.

However, after the grinding process, minute spiral and radial scratches 101 are caused on the rear surface of the semiconductor wafer 100 as shown in FIG. 15 of the accompanying drawings. If the semiconductor wafer 100 is diced along dicing streets 102 and 103 in the shape of a grid, scratches 101 on the rear surface of the semiconductor chips 104 will be dissimilar in their directions depending upon where the semiconductor chips 104 are present on the semiconductor wafer 100.

Figure 16:
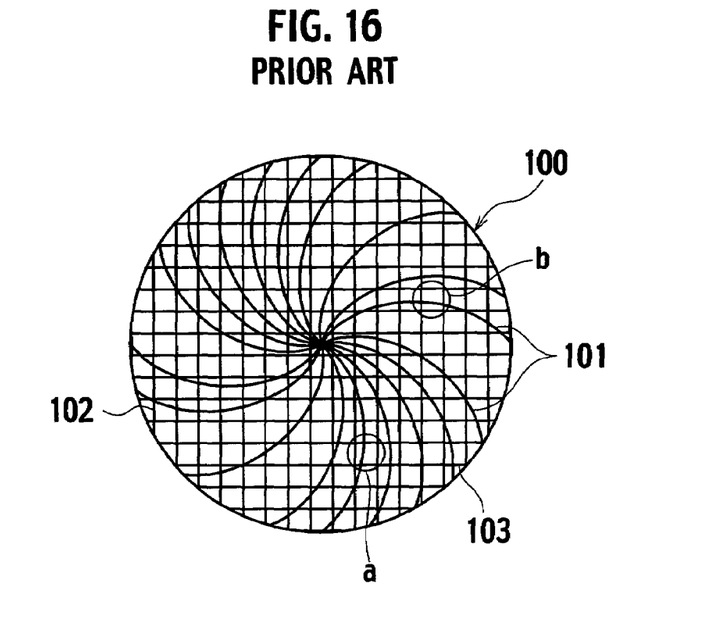
FIG. 16 is a plan view showing dicing streets on the rear surface of the semiconductor wafer and a semiconductor chip forming region.
Figure 17A:
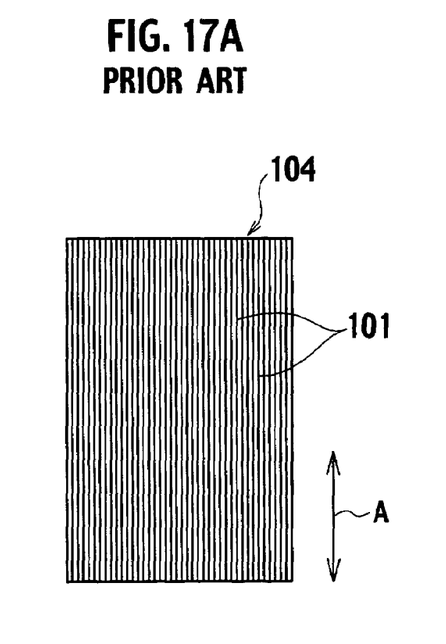
FIG. 17A is a plan view of a scratched rear surface of a semiconductor chip, scratches being present along a reference direction A.
Figure 17B:
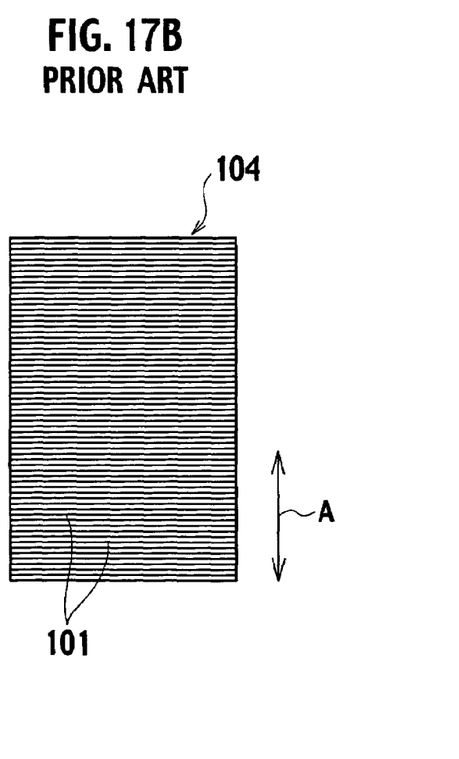
FIG. 17B is a plan view of a scratched rear surface of a semiconductor chip, scratches being perpendicular to the reference direction A.

For instance, it is assumed here that one semiconductor chip 104 is made in an area shown by a circle "a" as shown in FIG. 16. Referring to FIG. 17(B), the scratches 101 on the semiconductor chip 104 is in the shape of a pinstripe which is perpendicular to a reference direction A of the semiconductor chip 104. A circle "b" is at a position which is displaced by 90° from the circle "a" when the center of the semiconductor wafer 100 is assumed to match up the axis of rotation. The directions of the scratches 101 vary with the positions where the semiconductor chips 104 are made on the semiconductor wafer 100. In other words, the semiconductor chips 104 have scratches 104 whose directions are different.

It is assumed that such a semiconductor chip 104 is used as an electronic component, and an integrated circuit carrying surface of the semiconductor chip 104 is bonded to a wiring substrate via bumps using ultrasonic vibrations and thermo compression. The following problems will be caused. Since the scratches 101 on the rear surface of each semiconductor chip 104 are dissimilar in their directions, different frictional forces will be generated between rear surfaces of the semiconductor chips 104 and a bonding tool. There will be different bonding intensities between electrodes of each semiconductor chip 104 and electrodes of the wiring substrate. Therefore, it is very difficult to reliably and firmly bond the semiconductor chip 104 onto the wiring substrate.

SUMMARY OF THE INVENTION

The present invention is intended to provide a semiconductor device manufacturing method in which electrodes are reliably bonded with one other using thermo compression and ultrasonic vibrations. Further, the invention is aimed at providing a semiconductor wafer manufacturing method in which semiconductor chips are formed on a semiconductor wafer, and are reliably connected to electrodes using thermo compression and ultrasonic vibrations.

The semiconductor wafer manufacturing method includes forming a plurality of circuits on a diced main surface of a semiconductor wafer, the main surface of the semiconductor wafer serving as semiconductor chip forming regions; grinding a rear surface of the semiconductor wafer; and applying surface treatment to the rear surface of the semiconductor wafer and uniforming roughness of the rear surface of the semiconductor wafer, the rear surface being opposite to the main surface.

Further, the semiconductor manufacturing method includes forming a plurality of circuits on a diced main surface of a semiconductor wafer, the main surface of the semiconductor wafer serving as a semiconductor chip forming region; grinding a rear surface of the semiconductor wafer; applying surface treatment to the rear surface of the semiconductor wafer and uniforming roughness of the rear surface of the semiconductor wafer, the rear surface being opposite to the main surface; segmenting the semiconductor wafer for each semiconductor chip forming region, and producing a plurality of semiconductor chips; and bringing electrodes on a main surface of the semiconductor chip into contact with a target object via bumps, thermo-compressing the electrodes and a target object by applying ultrasonic vibrations from the rear surface of the semiconductor chip, thereby bonding the semiconductor chips to the target object via the bumps.

DETAILED DESCRIPTION OF THE INVENTION

The invention will be described with reference to embodiments shown in the drawings.

(Semiconductor Wafer Manufacturing Method)

According to the embodiment of the invention, semiconductor chips are made on a semiconductor wafer 1 of which main surface is diced along dicing streets (dicing areas or dicing lines), and which includes circuits or semiconductor elements.

Figure 1:
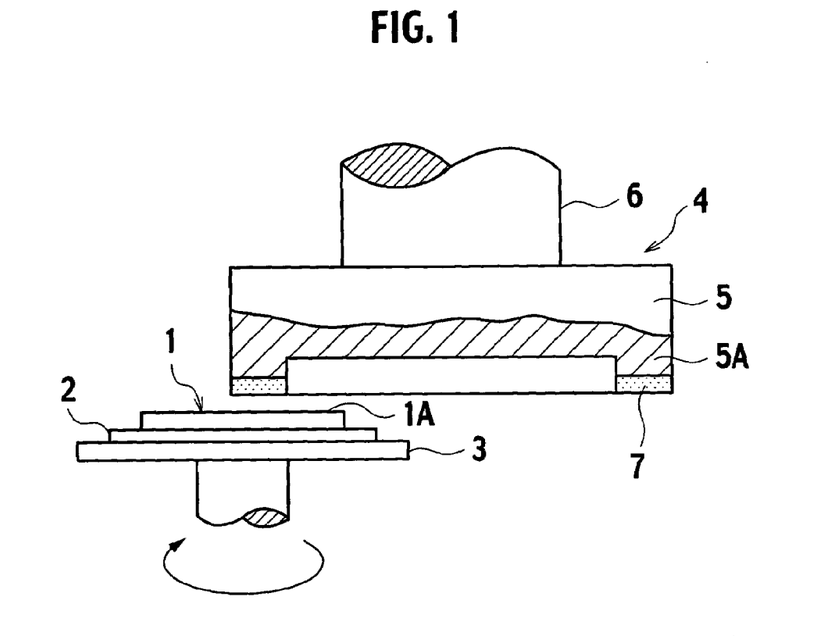
FIG. 1 is a partially exploded side elevation of a grinding machine used to make a semiconductor wafer.
Figure 2:
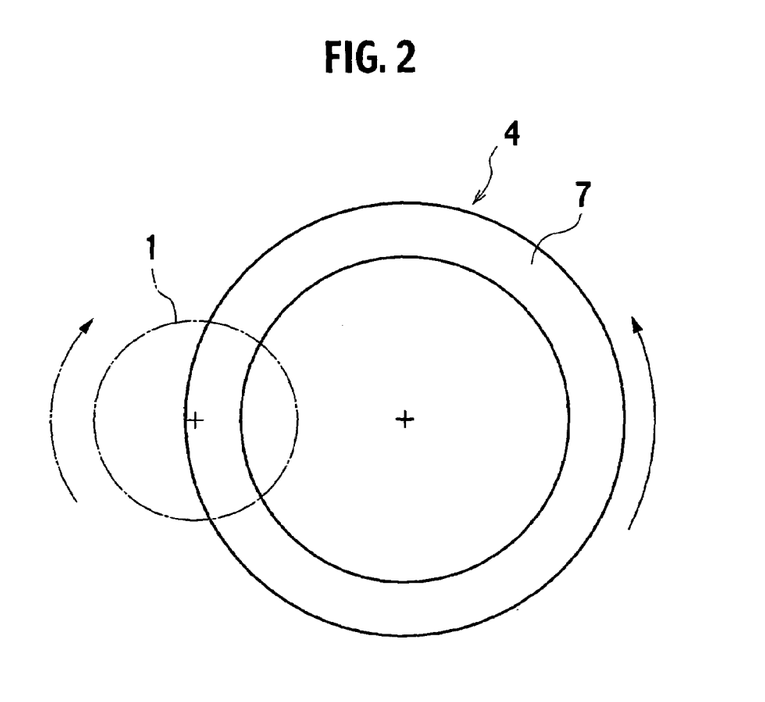
FIG. 2 schematically shows the relationship between a spindle and the semiconductor wafer.

Referring to FIG. 1, a resin film 2 is attached onto the main surface of the semiconductor wafer 1 in order to protect the circuits or semiconductor elements. The main surface of the semiconductor wafer 1 is vacuum-contacted onto a rotary stage 3 via the resin film 2. The center of the semiconductor wafer 1 matches a rotary shaft of the rotary stage 3, which includes a rotary drive and a vacuum contacting unit, not shown.

A spindle 4 is positioned above the rotary stage 3, and includes a spinning disk 5 and a drive shaft 6. One end of the drive shaft 6 is coupled to the center of one surface of the spinning disk 5. A drive unit (not shown) is coupled to the other end of the drive shaft 6, and rotates the drive shaft 6. The spinning disk 5 is provided with a bank 5A around its peripheral edge on the other surface thereof (shown at a lower side of the spinning disk 5). A whetstone 7 is integral to the bank 5A, and functions as a grinding surface facing with the rotary stage 3. The center of the whetstone 7 is designed to match the rotary center of the semiconductor wafer 1, i.e., the rotary center of the rotary stage 3.

Figure 3:
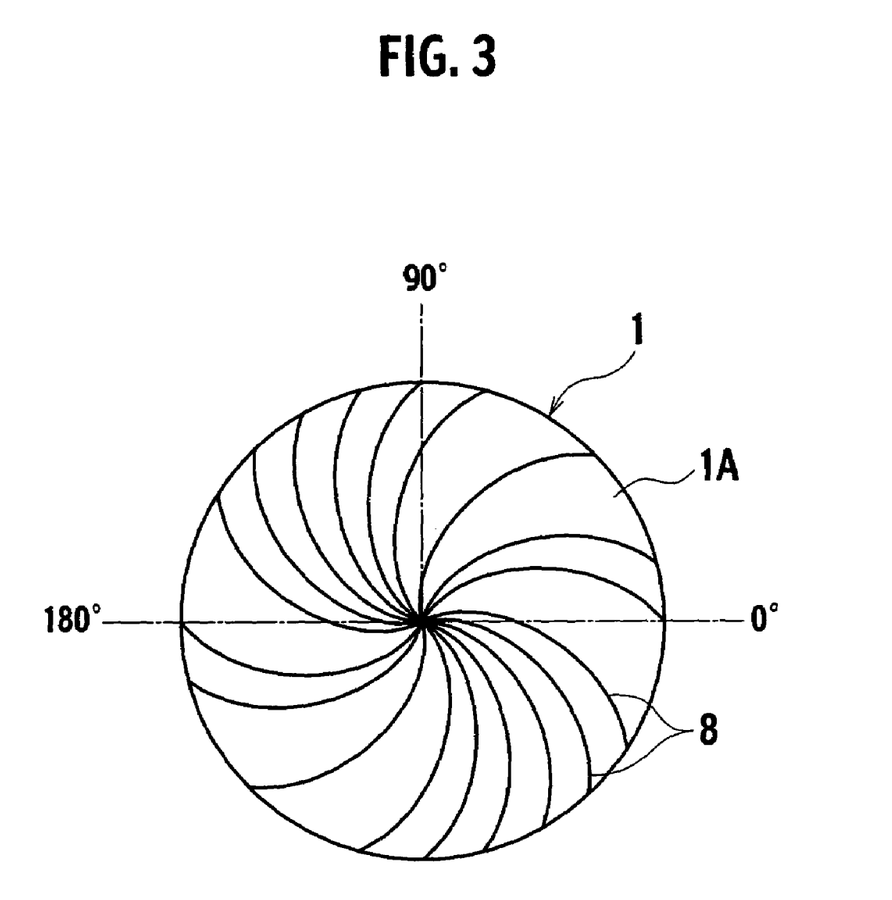
FIG. 3 is a plan view of a ground rear surface of the semiconductor wafer.

The entire rear surface of the semiconductor wafer 1 is fixedly placed on the rotary stage 3, and is ground by the whetstone 7 in response to the rotation of the rotary stage 3 and the spindle 4. The rear surface 1A of the semiconductor wafer 1 is opposite to the main surface thereof. The rear surface 1A of the semiconductor wafer 1 is physically ground until the semiconductor wafer 1 becomes approximately 600 µm thick to 260 µm thick. Although the physical grinding is efficient, the rear surface 1A may suffer from radial scratches 8 as schematically shown in FIG. 3. The scratches 8 are dissimilar in directions depending upon where they are present on the rear surface 1A of the semiconductor wafer 1.

Figure 4A:
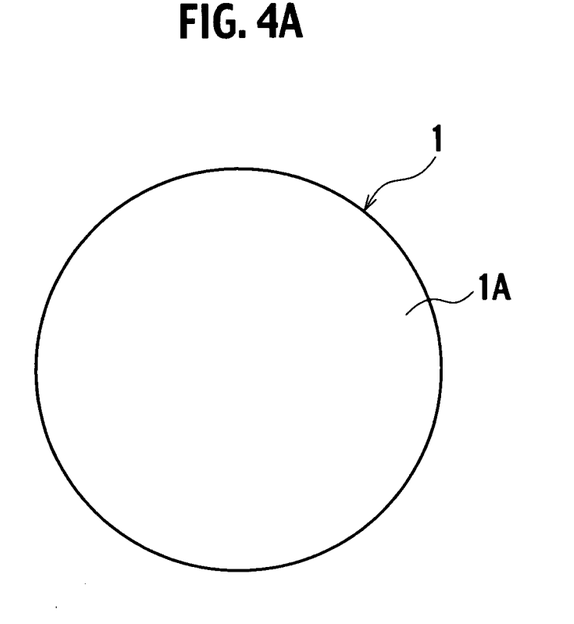
FIG. 4A and FIG. 4B show wet-etched rear surfaces of semiconductor wafers.
Figure 4B:
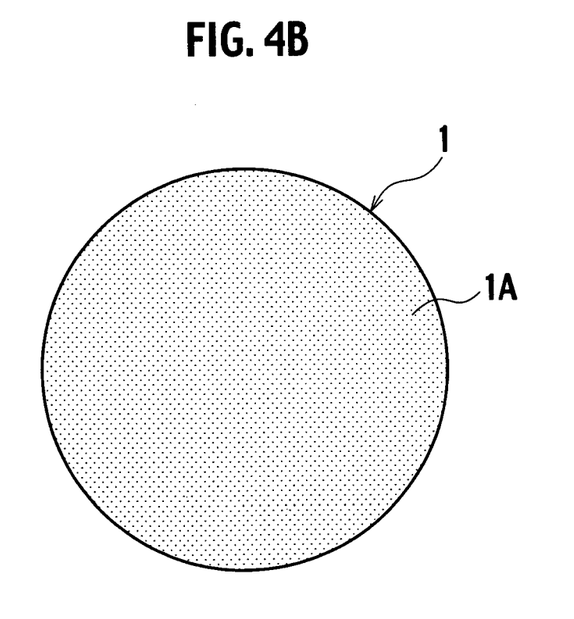

In this embodiment, the rear surface 1A of the semiconductor wafer 1 is entirely wet-etched, and is rinsed. For instance, an etchant containing oxidizing reagent and hydrogen fluoride solution is used for the wet-etching process. The semiconductor wafer 1 is wet-etched until it becomes approximately 250 µm thick. Hence, the rear surface 1A of the semiconductor wafer 1 is flattened as shown in FIG. 4A, or is dimpled as shown in FIG. 4B.

The scratches 8 on the ground rear surface 1A of the semiconductor wafer 1 are removed by the wet-etching process, which enables the semiconductor wafer 1 to have a uniformly flat rear surface. In a next process, the semiconductor wafer 1 is diced in order to produce semiconductor chips (10). The semiconductor chips 10 will be bonded onto a lead frame or a wiring substrate using ultrasonic vibrations (and thermo compression). In such a case, a frictional resistance between the rear surfaces of the semiconductor chips (i.e., the rear surface 1A of the semiconductor wafer 1) and a bonding tool can be made uniform on a plurality of semiconductor chips.

As shown in FIG. 3, a position where scratches 8 are perpendicular to the direction of the ultrasonic vibrations is defined to be a "0° position" of the semiconductor wafer 1, and a position where the reference position A and the direction of scratches are in agreement with one another is defined to be a "90° position" of the semiconductor wafer 1. In FIG. 3, the reference direction A and the direction of the ultrasonic vibrations are the same as those in FIG. 17A and FIG. 17B. When an arithmetic average roughness of the rear surface 1A of the semiconductor wafer 1 is measured in the reference direction A, an arithmetic average roughness of the rear surface 1A of the semiconductor wafer 1 at the 0° position is set to be equal to or less than 1.3 times of the arithmetic average roughness at the 90° position of the rear surface 1A of the semiconductor wafer 1. In other words, the arithmetic average roughness of the rear surface of the semiconductor chip 10 at the 0° position is set to be equal to or less than 1.3 times of the arithmetic average roughness of the semiconductor chip 10 at the 90° position.

(Method of Manufacturing a Semiconductor Device)

A semiconductor device manufacturing method includes the foregoing semiconductor wafer manufacturing method. The same or like members are assigned with the same or like reference numerals used with respect to the semiconductor wafer manufacturing method. Semiconductor chips 10 are bonded onto a lead frame as a target object, thereby making a semiconductor device.

Figure 5:
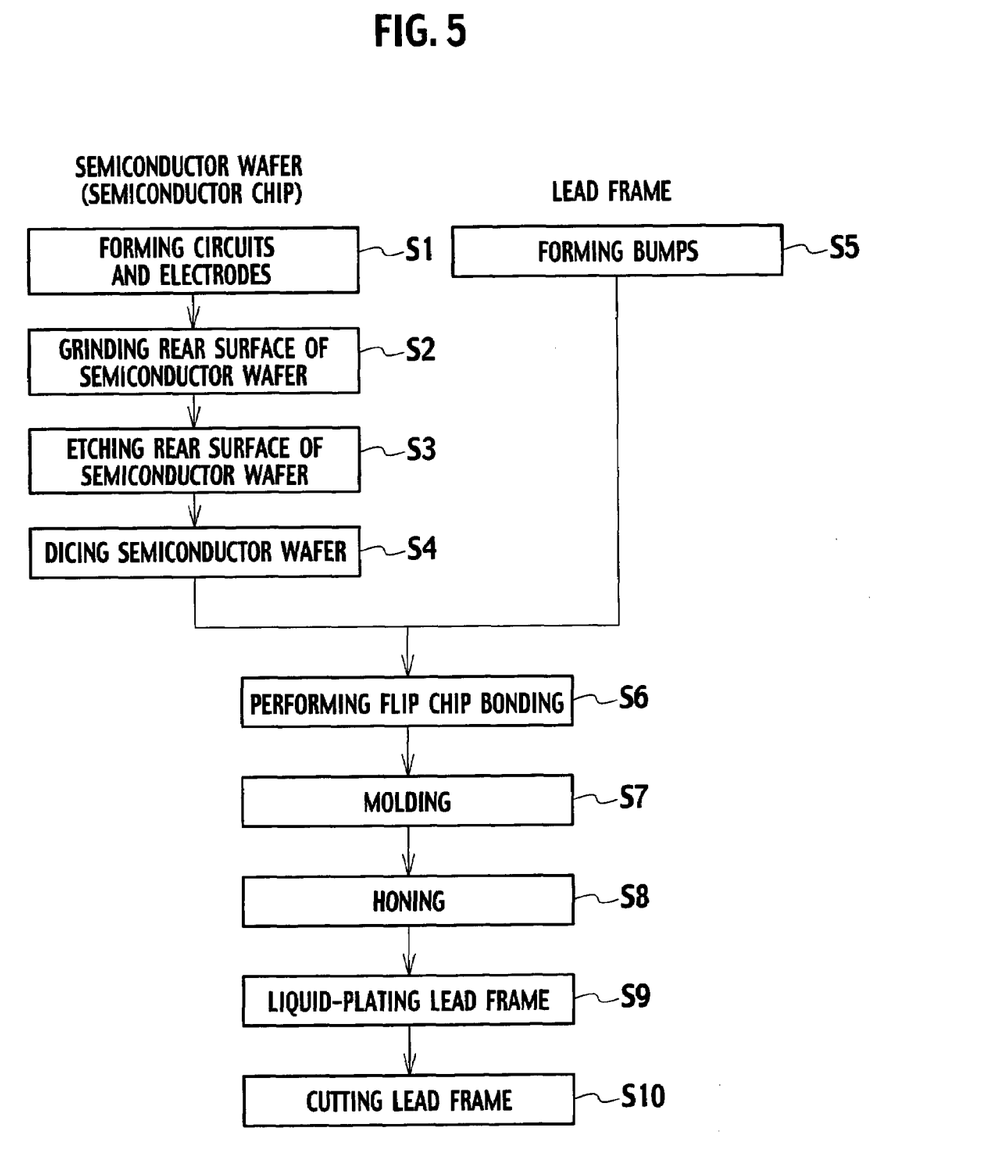
FIG. 5 is a flowchart of a process for manufacturing the semiconductor wafer and a semiconductor device.
Figure 6:
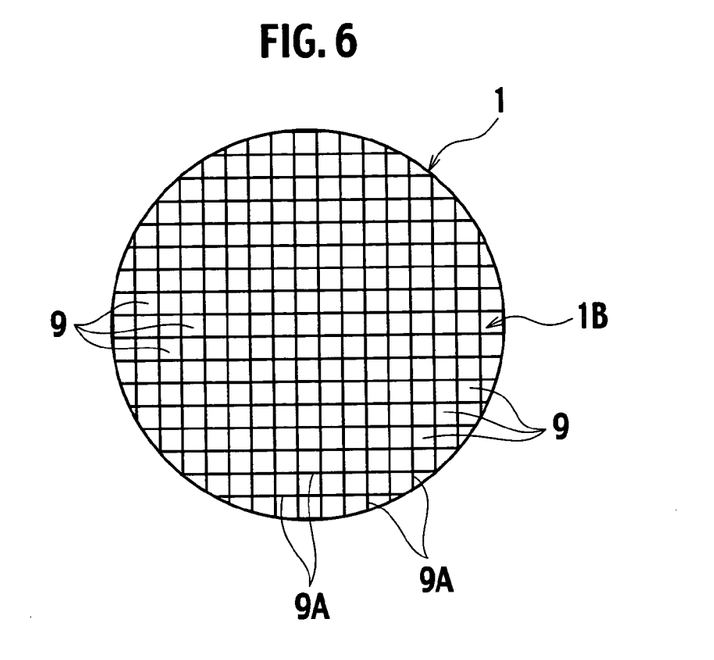
FIG. 6 is plan view of a rear surface of the semiconductor wafer manufactured according to the invention.

The semiconductor device is produced from the semiconductor wafer through the steps in FIG. 5. A plurality of semiconductor forming regions 9 are regularly arranged on the main surface 1B of the semiconductor wafer 1, thereby producing semiconductor chips having a plurality of chip forming areas 9 where circuits and electrodes are formed thereon by a well-known semiconductor manufacturing method (step S1). Refer to FIG. 6.

The entire rear surface 1A of the semiconductor wafer 1 is mechanically ground as described above (step S2).

The rear surface 1A of the semiconductor wafer 1 is wet-etched and rinsed (step S3), thereby reducing scratches 8 on the rear surface 1A (refer to FIG. 3), and smoothing the rear surface 1A.

The semiconductor wafer 1 is diced along dicing streets 9A in order to define the chip forming regions 9. The adjacent chip forming regions 9 are cut out, thereby obtaining segmented semiconductor chips 10 (step S4).

Figure 7A:
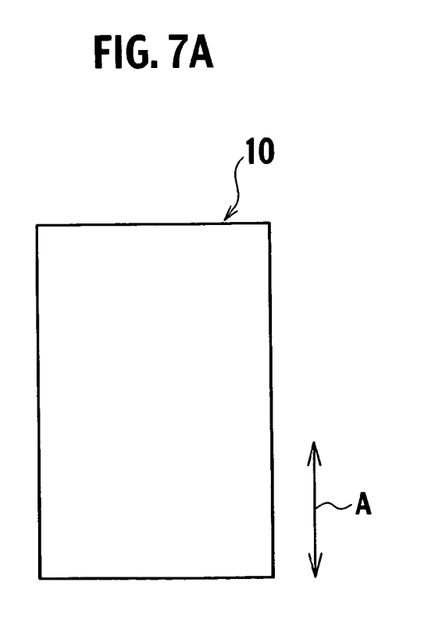
FIG. 7A and FIG. 7B are plan views of rear surfaces of segmented semiconductor chips.
Figure 7B:
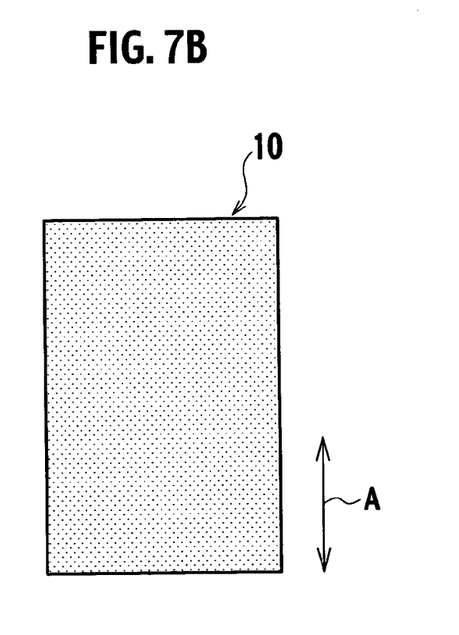

FIG. 7A shows a rear surface of a semiconductor chip 10 which is made of a semiconductor wafer 1 having a flat rear surface 1A while FIG. 7B shows a rear surface of a semiconductor chip 10 which is made of a semiconductor wafer 1 having a dimpled rear surface 1A. In either case, roughness of the rear surfaces 1A of the semiconductor wafers 1 is made uniform, so that the roughness of rear surfaces of the semiconductor chips 10 is also made uniform. The dimpled rear surface 1A can be made by the microwet-etching process using an etchant mainly made of a hydrogen peroxide solution and sulfuric acid.

Figure 8:
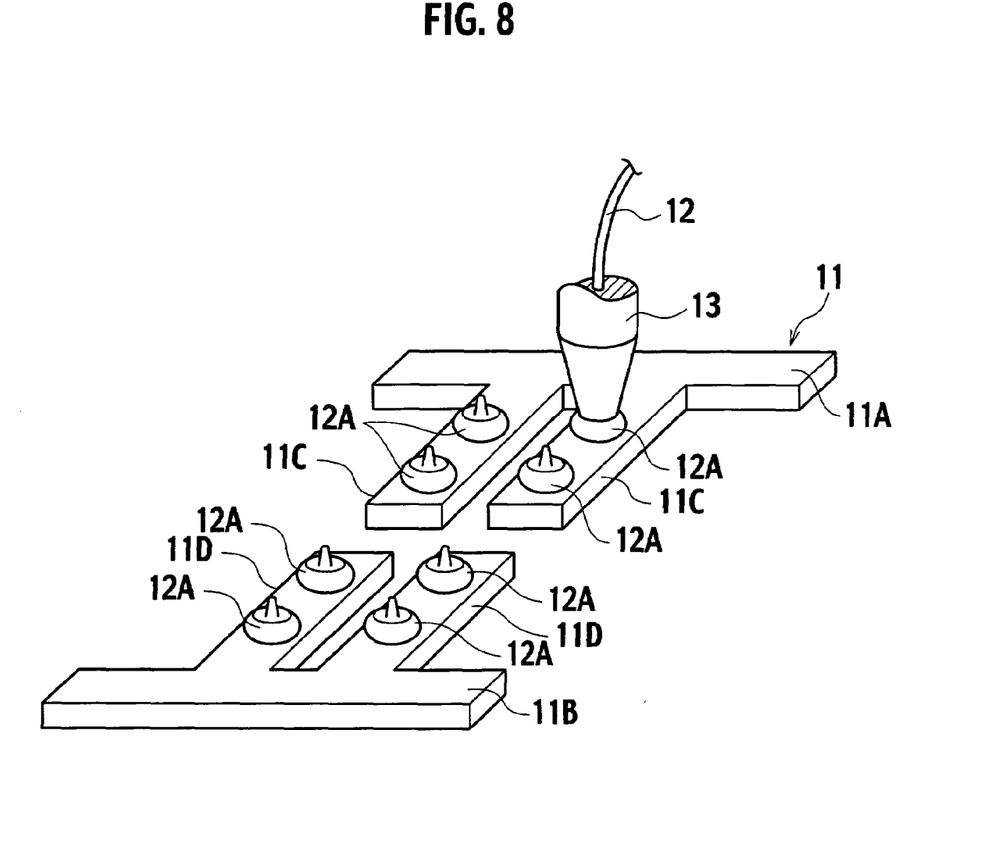
FIG. 8 is a perspective view of a lead frame showing how bumps are formed.

In step S5, stud bumps (or ball bumps) are formed on the lead frame 11 as shown in FIG. 8. The lead frame 11 includes frame parts 11A and 11B which are parallel. The frame part 11A includes a pair of lead parts 11C while the frame part 11B includes a pair of lead parts 11D. The lead parts 11C face with the lead parts 11D. Gold stud bumps 12A are made on the lead parts 11C and 11D at predetermined positions using a capillary 13 through which a metal wire passes. Specifically, the metal wire is bonded onto the lead parts 11C and 11D by the thermo-compression and ultrasonic vibrations. Thereafter, the capillary 13 is turned off from the lead parts 11C and 11D, and the metal wire 12 is torn off, so that the gold stud bumps 12A will be formed.

Figure 9:
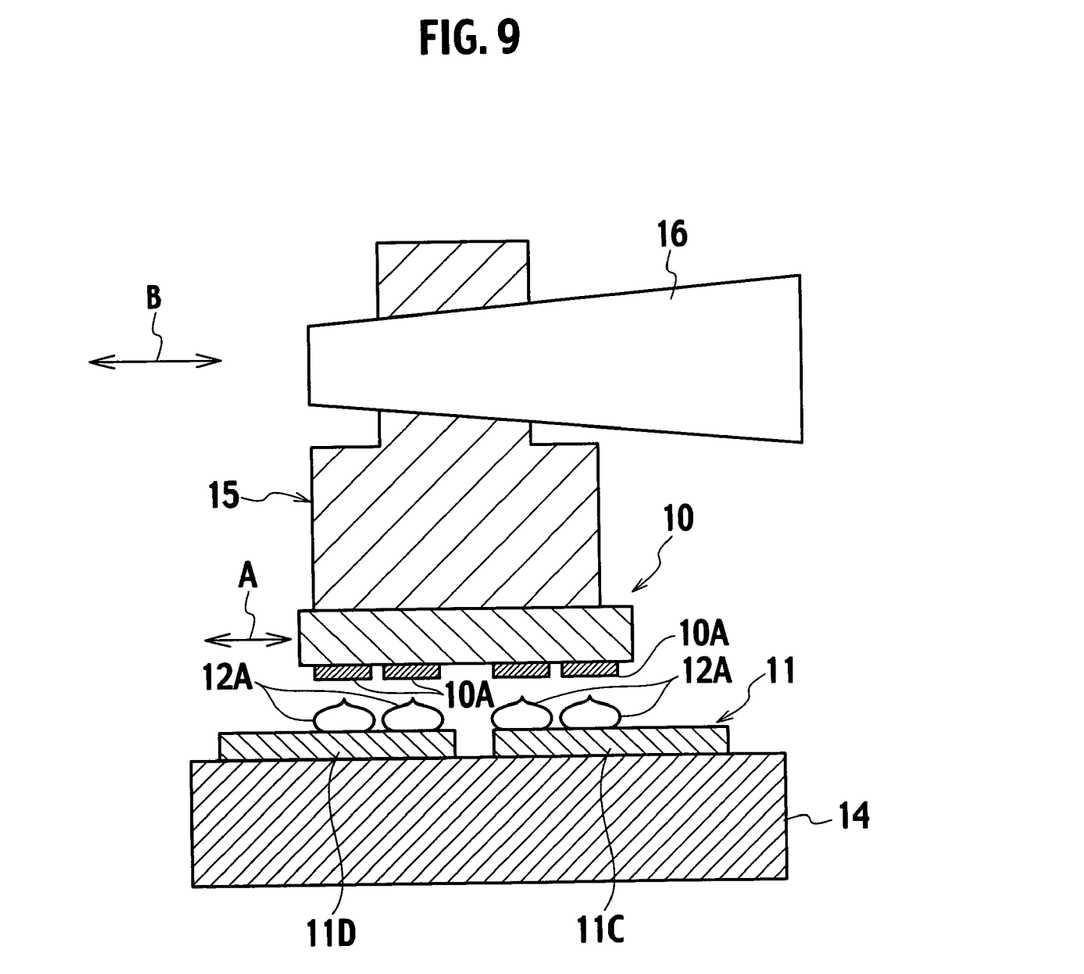
FIG. 9 shows how a flip chip bonding process is conducted by a bonding tool.

The lead frame 11 is placed on a work stage 14 of a thermo compressor using ultrasonic vibrations as shown in FIG. 9. Bonding pads 10A are bonded onto the lead parts 11C and 11D via the gold stud bumps 12A using the bonding tool 15 (step S6). The work stage 14 includes a heater (not shown), which heats the lead frame 11 to approximately 200° C. The bonding tool 15 includes a vacuum adsorber (not shown) which adsorbs and holds the semiconductor chip 10, and a ultrasonic horn 16 applying ultrasonic vibrations.

Referring to FIG. 9, the rear surface of the semiconductor chip 10 is adsorbed on and held by the bonding tool 15 in such a manner that the reference direction A of the semiconductor chip 10 is parallel to the direction of ultrasonic vibrations applied to the bonding tool 15 from the ultrasonic horn 16. In this state, the bonding pads 10A on the main surface of the semiconductor chip 10 face with the work stage 14. In other words, the gold stud bumps 12A on the lead parts 11C and 11D of the lead frame 11 face with the bonding pads 10A of the semiconductor chip 10. Then, the bonding tool 15 is lowered, and thermally compresses the bonding pads 10A and the stud bumps 12A with ultrasonic vibrations applied thereto from the ultrasonic horn 16. A bonding load of 1.25 (N) is applied in this case, for example. Ultrasonic vibrations are applied for 200 msec at a 1 W output power. Hence, the bonding pads 14 are bonded onto the lead parts 11C and 11D.

The semiconductor chips 10 made of the semiconductor wafer 1, which has been manufactured as described above, can have a uniform roughness on the rear surfaces in the reference direction A. Therefore, when the semiconductor chips 10 made of the same semiconductor wafer 1 undergo the thermo compression using ultrasonic vibrations, the frictional force can be made equal between the bonding tool 15 and the rear surfaces of the semiconductor chips 10. Therefore, it is possible to control unreliable bonding of the semiconductor chips 10 when a plurality of semiconductor chips 10 are bonded onto the lead frame 11.

The semiconductor chips 10 bonded onto the lead frame 11 are subject to a transfer molding process (step S7), a honing process (step S8), a lead plating process (step S9), and a lead cutting process (step S10). After these processes, a semiconductor device will be completed.

According to the foregoing manufacturing method, the rear surfaces 1A of semiconductor chips 10 made of one semiconductor wafer 10 can have the uniform surface roughness. This can equalize the frictional force caused by ultrasonic vibrations applied between the bonding tool 15 and the rear surface 1A of the semiconductor wafer 1 when the semiconductor chips 10 are bonded onto the lead frame 11. The semiconductor chips 10 can be reliably bonded onto the lead frame 11 in each bonding process, which is effective in boosting yield of semiconductor devices.

(Measurement Results of Surface Roughness)

The following describe an allowable range of surface roughness of a plurality of semiconductor chips 10 made of one semiconductor wafer 1.

The rear surface 1A of the semiconductor wafer 1 is mechanically ground, and is then diced, thereby making semiconductor chips 10. Rear surface roughness Ra is measured along the reference direction A of the semiconductor chip 10. Scratches 8 on the rear surface of the semiconductor chip 10 made at the "0° position" of the semiconductor wafer 1 are perpendicular to the reference direction A. On the other hand, scratches 8 on the rear surface of the semiconductor chip 10 made at the "90° position" of the semiconductor wafer 1 are parallel to the reference direction A.

Figure 10:
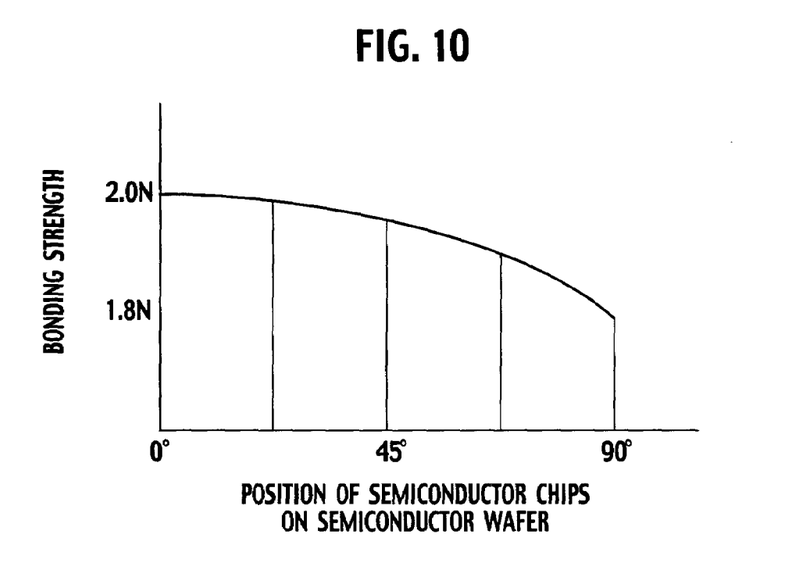
FIG. 10 is a graph showing the relationship between bonding strength and a position of a semiconductor chip on a semiconductor wafer prior to a dicing process.

FIG. 10 shows results of bonding strength measured between the lead frame 11 and the semiconductor chips 10 made at the "0° position" and at the "90° position" of the semiconductor wafer 1, respectively. The bonding strength between the "90° position" semiconductor chips 10 and the lead frame 11 is 1.8 (N) while that between the "0° position" semiconductor chips 10 and the lead frame 11 is 2.0 (N).

Figure 11:
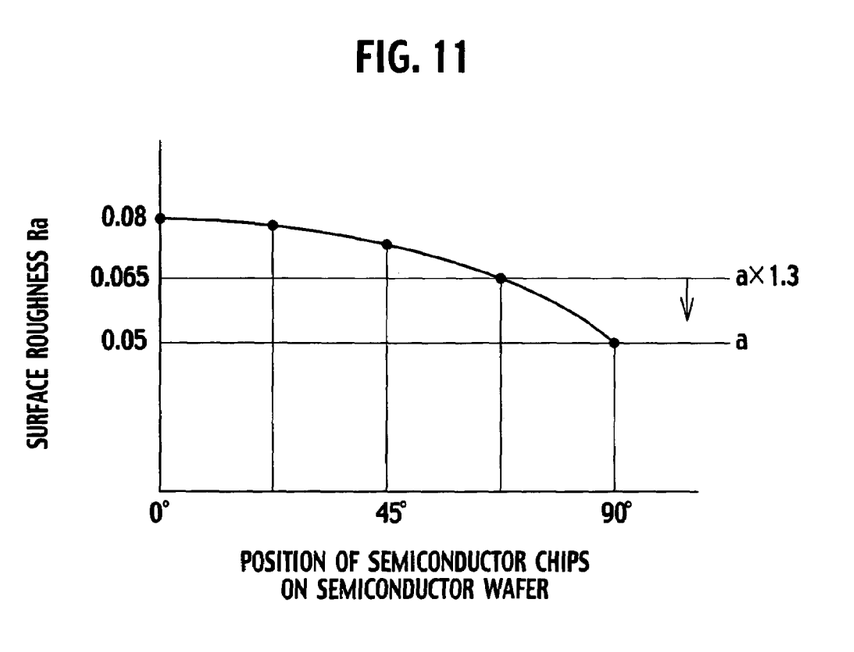
FIG. 11 is a graph showing the relationship between the position of the semiconductor chip on a semiconductor wafer prior to the dicing and roughness of a rear surface of the semiconductor chip.

An arithmetic average of the surface roughness Ra is as shown in FIG. 11 with respect to the foregoing semiconductor chips 10. The arithmetic average Ra of the "90° position" semiconductor chips 10 is 0.05 while the arithmetic average Ra of the "0°-position" semiconductor chips 10 is 0.08.

The measured results shown in FIG. 11 are also applicable to "180° position" semiconductor chips 10, "270° position" semiconductor chips 10 and "360° position" semiconductor chips 10.

The semiconductor wafer 1 is ground on its rear surface 1A, and is then is wet-etched so that the surface roughness Ra of the semiconductor chips 10 is controlled to be 0.065 or less. The semiconductor chips 10 are then bonded onto the lead frame 11 using ultrasonic vibrations and thermo compression. Therefore, the bonding strength of the "0° position" semiconductor chips 10 and the "90° position" semiconductor chips 10 can be substantially uniform. However, if some "0° position" semiconductor chips 10 have the surface roughness of 0.065 or larger, a plurality of semiconductor chips 10 made of the same semiconductor wafer 1 may have different levels of the bonding strength.

The foregoing problem can be overcome as follows. The wet-etching process is controlled such that the surface roughness of the wet-etched semiconductor chips 10 at the "0° position" of the semiconductor wafer 1 is 1.3 times or less than the rear surface roughness Ra of the semiconductor chip 10 at the "90° position" of the ground semiconductor wafer 1. Therefore, the levels of the bonding strength of the semiconductor chips 10 can be equalized. Further, even when a different spindle may be used in place of the spindle 6 to grind the rear surface 1A of the semiconductor wafer 1, a curve showing the rear surface roughness Ra of the semiconductor chips 10 at the "0° position" and "90° position" of the semiconductor wafer 1 is substantially similar to that shown in FIG. 11.

In the foregoing embodiment, the rear surface of the semiconductor wafer 1 is ground and wet-etched. Hence, the arithmetic average rear surface roughness Ra of the semiconductor chips 10 which has the scratches 8 perpendicular to the reference direction A is 1.3 times or less than the arithmetic average rear surface roughness Ra of the semiconductor chips 10 having the scratches 8 parallel to the reference direction A. This is effective in equalizing the bonding strength of the semiconductor chips 10.

The semiconductor chips 10 are bonded onto the lead frame 11 using ultrasonic vibrations and thermo-compression, so that the arithmetic average rear surface roughness Ra of the semiconductor chips 10 in the reference direction A can be made uniform. When the direction of the ultrasonic vibrations is parallel to the reference direction A of the semiconductor chips 10, semiconductor chips 10 made at different positions on the semiconductor wafer 1 can have the same bonding strength. This is effective in boosting yield of semiconductor devices.

(Other Embodiments)

Although the invention has been described with reference to a particular embodiment, it is to be understood that this embodiment is merely illustrative of the application of the principles of the invention and should not be construed in a limiting manner. Numerous other modifications may be made and other arrangements may be devised without departing from the spirit and scope of the present invention.

In the foregoing embodiment, the gold stud bumps 12A are formed on the lead parts 11C and 11D of the lead frame 11. Alternatively, gold stud bumps 12A may be formed on the bonding pad 10A. Further, the semiconductor chips 10 are bonded onto the lead frame 12 using gold stud bumps 12A. Alternatively, the stud bumps 12A may be made of a conductive material such as aluminum, copper and so on. Still further, balls bumps may be used in place of the stud bumps.

The semiconductor chips 10 are bonded onto the lead frame 11 in the foregoing embodiment. Alternatively, the semiconductor chips 10 may be bonded onto an electrode pattern (an interconnection pad) of a wiring substrate.

Figure 12A:
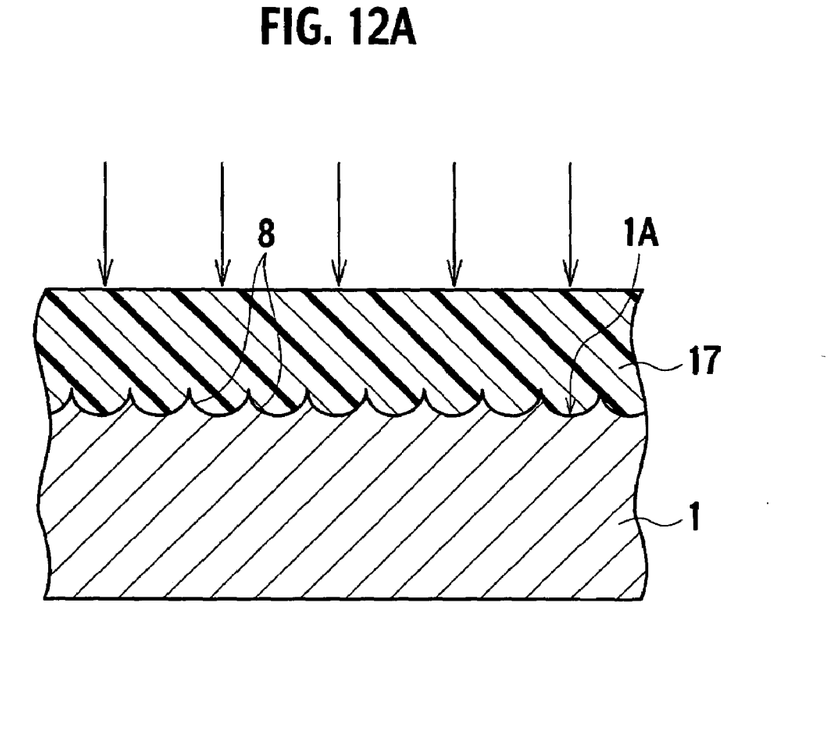
FIG. 12A and FIG. 12B show how the semiconductor wafer is etched back.
Figure 12B:
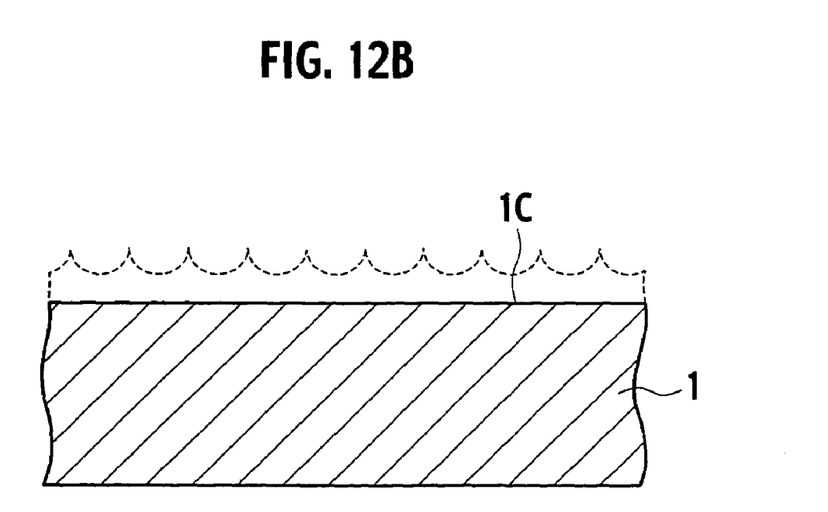

The semiconductor wafer 1 has its rear surface 1A ground, and is then wet-etched in the foregoing embodiment. Alternatively, the rear surface 1A of the semiconductor wafer 1 may be planarization etched back as shown in FIG. 12A and FIG. 12B. Specifically, the rear surface 1A of the semiconductor wafer 1 is physically ground, and is applied photoresist 17 in order to cover scratches 8 on the rear surface 1A. Hence, a flat rear surface 1C will be obtained. An etching rate of the photoresist is approximately equal to that of the semiconductor wafer 1.

Figure 13:
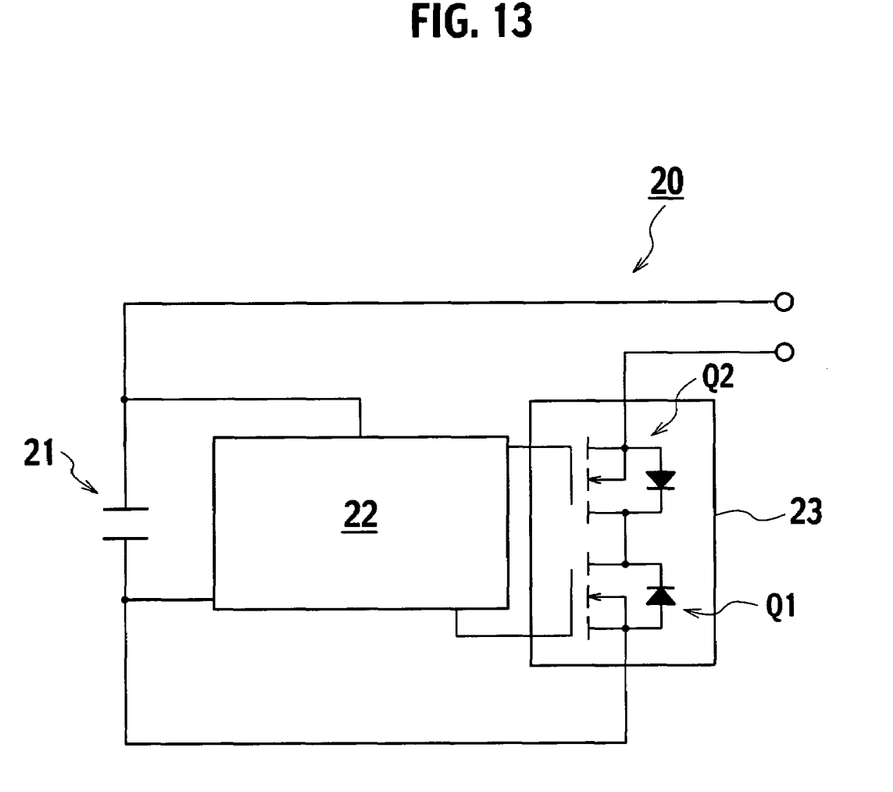
FIG. 13 shows an equivalent circuit of a battery pack to which the semiconductor manufacturing method is applicable.
Figure 14:
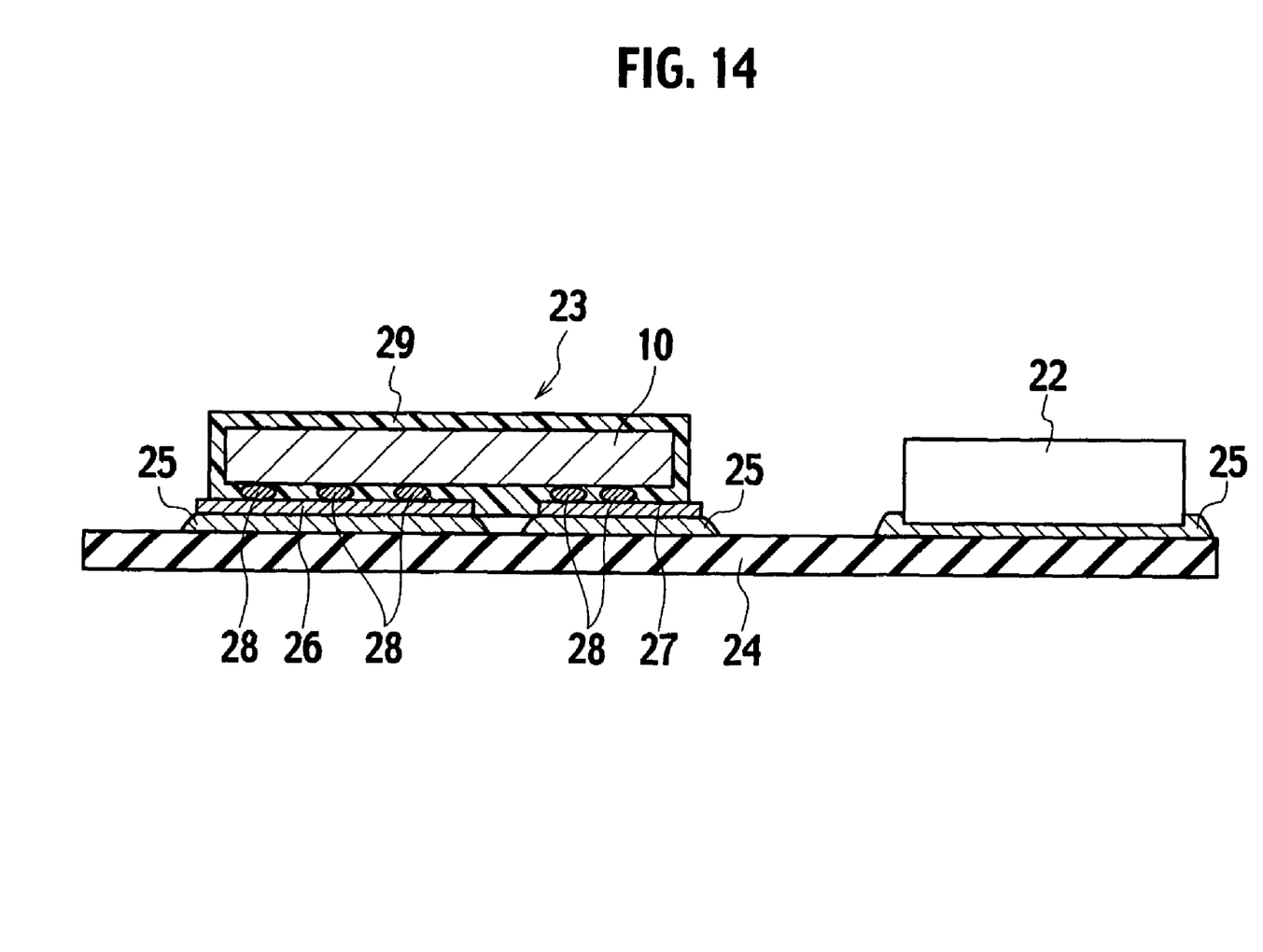
FIG. 14 is a cross section of a wiring substrate of the battery pack.

The semiconductor manufacturing method of the invention is applicable to manufacturing a battery pack 20 for a cellular phone as shown in FIG. 13 and FIG. 14. The battery pack 20 comprises a lithium battery cell 21, a control IC 22 connected in parallel with the battery cell 21, and a protector circuit chip 23 connected in series with the battery cell 21. The protector circuit chip 23 includes a first MOS transistor A1 and a second MOS transistor Q2, and controls charging and discharging of the battery cell 21 in response to a voltage signal from the control IC 22.

The control IC 22 and the protector circuit chip 23 are mounted on a wiring substrate 24 as shown in FIG. 14. The control IC 22 is electrically and mechanically connected to electrodes on the wiring substrate 24 using solder 25. Further, the protector circuit chip 23 is manufactured according to the semiconductor manufacturing method mentioned above, and is bonded onto lead parts 26 and 27 via stud bumps 28. Hence, the control IC 22 is connected to electrodes (not shown) of the semiconductor chip 10. The thermo-compression bonding using ultrasonic vibrations is adopted in the foregoing bonding process. The semiconductor chip 10 is sealed by a sealer 29 except for the lead parts 26 and 27. The lead parts 26 and 27 are a part of the lead frame, and is soldered on the wiring substrate 24.

The present invention offers the method of manufacturing the semiconductor wafer 1, on which the semiconductor chips 10 can be reliably bonded onto the lead frame 11.

Further, semiconductor chips 10 can be reliably bonded onto the lead frame, for example, using ultrasonic vibrations, which is effective in boosting yield.

What is claimed is:

1. A method of manufacturing a semiconductor device, the method comprising:

forming a plurality of circuits in a chip forming region defined on a main surface of a semiconductor wafer:

grinding a rear surface of the semiconductor wafer; the rear surface being opposite to the main surface;

applying surface treatment to the rear surface to achieve a uniform roughness in a back surface that opposes and corresponds to each of the chip forming regions;

segmenting the semiconductor wafer so as to separate the chip forming regions from one another, thereby, producing semiconductor chips;

laying an electrode formed on the semiconductor chip onto a target object so that a bump is interposed therebetween; and thermo-compressing the electrodes and a target object by applying ultrasonic vibrations thereto from the back surface of the semiconductor chips, thereby bonding the semiconductor chips to the target object via the bumps;

wherein the surface treatment is applied in a particular direction corresponding to a direction of the ultrasonic vibration so that a substantially uniform roughness is achieved in the direction of the ultrasonic vibration between the semiconductor chips.

2. The method of manufacturing the semiconductor device of claim 1, wherein the thermo-compressing process using ultrasonic vibrations is executed by bringing a bonding tool into contact with the rear surface of the semiconductor chips, and the bonding tool applies ultrasonic vibrations to the semiconductor chips.

3. The method of manufacturing the semiconductor device of claim 1, wherein the rear surface treatment is executed in order to uniformly reduce scratches on the ground rear surfaces of the semiconductor wafer.

4. The method of manufacturing the semiconductor device of claim 1, wherein the rear surface treatment is a wet- or dry-etching process.

5. The method of manufacturing the semiconductor device of claim 1, wherein the rear surface treatment is a micro-wet etching process.

6. The method of manufacturing the semiconductor device of claim 1, wherein the rear surface treatment includes forming a resist on the rear surface of the semiconductor wafer, an etching selective ratio of the resist being substantially equal to an etching selective ratio of the semiconductor wafer; and the resist is removed by the dry etching process, and the rear surface of the semiconductor wafer is dry-etched until scratches on the ground semiconductor wafer are reduced.

7. The method of manufacturing the semiconductor device of claim 1, wherein the target object to which the semiconductor chips are bonded via bumps is a lead frame or a wiring substrate.

8. The method of manufacturing the semiconductor device of claim 1, wherein the rear surface of the semiconductor wafer is ground in response to the rotation of the semiconductor wafer and a grinding disk which revolves round the central and rotary axis of the semiconductor wafer.

9. The method of manufacturing the semiconductor device of claim 8, wherein arithmetic average roughness of a first rear surface of first scratches which are caused on the ground rear surface of the semiconductor wafer in a first direction and are subject to the rear surface treatment is 1.3 times or less of arithmetic average roughness of a second rear surface of second scratches which are caused on the ground rear surface of the semiconductor wafer in a second direction and are subject the rear surface treatment, the second scratches being perpendicular to the first direction.

* * * * *